(12) United States Patent
Yashiro (10) Patent No.: US 7,361,997 B2
(45) Date of Patent: Apr. 22, 2008

(54) DEVICE PACKAGE, A PRINTED WIRING BOARD, AND AN ELECTRONIC APPARATUS WITH EFFICIENTLY SPACED BOTTOM ELECTRODES INCLUDING INTERVALS BETWEEN BOTTOM ELECTRODES OF DIFFERENT LENGTHS

(75) Inventor: Akira Yashiro, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 108 days.

(21) Appl. No.: 10/995,308

(22) Filed: Nov. 24, 2004

(65) Prior Publication Data

US 2005/0127520 A1 Jun. 16, 2005

(30) Foreign Application Priority Data

Dec. 1, 2003 (JP) .............................. 2003-401439

(51) Int. Cl.
*H01L 23/48* (2006.01)
(52) U.S. Cl. .................. 257/786; 257/690; 257/738; 257/780; 257/E23.069
(58) Field of Classification Search ................ 257/734, 257/773, 700, 775, 776, 207, 691, E23.079, 257/738, 780, 781, E23.021, E23.069, 690, 257/697, 698, 786; 361/764, 748, 794, 803
See application file for complete search history.

(56) References Cited

U.S. PATENT DOCUMENTS

| | | | | |
|---|---|---|---|---|
| 5,641,946 A | * | 6/1997 | Shim, II ..................... | 174/261 |
| 5,847,936 A | * | 12/1998 | Forehand et al. ............ | 361/794 |
| 5,849,606 A | * | 12/1998 | Kikuchi et al. ............. | 438/108 |
| 5,856,212 A | * | 1/1999 | Chun ......................... | 438/126 |
| 6,225,702 B1 | * | 5/2001 | Nakamura ................... | 257/786 |
| 6,534,875 B1 | | 3/2003 | Nishiyama | |
| 6,545,876 B1 | * | 4/2003 | Kwong et al. .............. | 361/780 |
| 6,780,023 B2 | * | 8/2004 | Miyagawa ................... | 439/68 |
| 6,900,551 B2 | * | 5/2005 | Matsuzawa et al. ......... | 257/786 |
| 6,919,227 B2 | | 7/2005 | Nishiyama | |
| 6,972,382 B2 | * | 12/2005 | Zollo et al. ................. | 174/262 |
| 7,005,753 B2 | * | 2/2006 | Seaman et al. ............. | 257/786 |
| 2003/0011074 A1 | * | 1/2003 | Jung ........................ | 257/773 |
| 2004/0002206 A1 | | 1/2004 | Yashiro | |
| 2005/0167851 A1 | | 8/2005 | Nishiyama | |

FOREIGN PATENT DOCUMENTS

| | | |
|---|---|---|
| JP | 10-233462 | 9/1998 |
| JP | 11-68026 | 3/1999 |
| JP | 2000-100986 | 4/2000 |
| JP | 2000-236155 | 8/2000 |
| JP | 2001-44325 | 2/2001 |
| JP | 2001-177001 | 6/2001 |
| JP | 2002-270723 | 9/2002 |
| JP | 2003-283081 | 10/2003 |

* cited by examiner

*Primary Examiner*—Marcos D. Pizarro
(74) *Attorney, Agent, or Firm*—Oblon, Spivak, McClelland, Maier & Neustadt, P.C.

(57) ABSTRACT

A device package, such as a BGA, to be mounted on a printed wiring board (PWB) is disclosed. The bottom electrodes of the device package are arranged in an array such that intervals between the edges of the bottom electrodes become different from place to place. The intervals may be set wider at the peripheral positions of the bottom electrodes. The PWB includes pads that are located at positions corresponding to the bottom electrodes.

17 Claims, 6 Drawing Sheets

DEVICE PACKAGE, A PRINTED WIRING BOARD, AND AN ELECTRONIC APPARATUS WITH EFFICIENTLY SPACED BOTTOM ELECTRODES INCLUDING INTERVALS BETWEEN BOTTOM ELECTRODES OF DIFFERENT LENGTHS

BACKGROUND OF THE INVENTION

1. Field of the Invention

The present invention generally relates to semiconductor integrated circuit technology, and especially relates to a technology of efficiently providing wires from a device package having bottom electrodes, such as a BGA (Ball Grid Array), to a printed wiring board (PWB), on which the device package is mounted.

2. Description of the Related Art

Device packages, i.e., semiconductor integrated circuits, are required to provide a great number of pins in small dimensions for high-density mounting. In concert with the miniaturization (high-density) of the device packages, high-density wiring of the PWB is required. However, it is often difficult to provide a sufficient number of connections between elements within a desired small space.

In order to pull out wiring from the inner positions of the device package (an electronic part) having bottom electrodes, such as a BGA, the number of layers of the PWB must be increased, wires have to be made fine, and a high degree of freedom for inter-layer wiring (build-up, and the like) is required. Further, it is predicted that connections between the elements will become impossible in the near future even if the build-up technology is used.

Conventionally, as Patent Reference 1 proposes, an "auxiliary device package for wiring" is used such that wiring to/from external terminals (bottom electrodes, etc.) arranged at the central part of the BGA device package is enabled, and the number of layers of the PWB is increased where wiring is dense so that the wiring difficulty is alleviated.

Nevertheless, with the conventional technology, the auxiliary device package for wiring is additionally required, and an increased number of layers in the PWB is required, which raise costs and increase dimensions.

[Patent reference 1] JPA 11-68026

SUMMARY OF THE INVENTION

Accordingly, it is a general object of the present invention to provide a device package, a printed wiring board (PWB), and an electronic apparatus that substantially obviate one or more of the problems caused by the limitations and disadvantages of the related art.

Features and advantages of the present invention are set forth in the description that follows, and in part will become apparent from the description and the accompanying drawings, or may be learned by practice of the invention according to the teachings provided in the description. Objects as well as other features and advantages of the present invention will be realized and attained by a device package, a PWB, and an electronic apparatus particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides as follows.

According to the present invention, intervals (spaces) between edges of electrodes of the device package are set to be different from place to place, the device having bottom electrodes, such as a BGA, and the device package being mounted on a printed wiring board (PWB). For example, the difference is obtained by providing electrode terminals at different intervals, by making the electrode array into the shape of a non-grid, and by making the sizes of the electrodes vary. The difference is such that the intervals between the edges of the electrodes positioned on the peripheral side of the array are set greater than the intervals between the edges of the electrodes positioned on the inner side. Alternatively, the intervals between the edges of the electrodes on the peripheral side are set smaller than the intervals between the edges of the electrodes on the inner side. Further, the present invention provides a PWB wherein pads are prepared corresponding to the electrodes of the device package. Further, the present invention provides an electronic apparatus that includes the device package and the PWB of the present invention.

EFFECT OF THE INVENTION

In the present invention, the intervals between the edges of the pads of the PWB are set to vary corresponding to the arrangement of the electrodes of the device package. Different intervals of the pads provide for different numbers of wires that can be provided between the pads, and a relatively greater interval provides a space for a via (etched pathway). In this manner, a greater number of wires can be provided between the device package and the PWB. For example, the interval between the edges of the electrodes is made to be different by providing no electrodes at a position of an array of electrodes corresponding to an electrode of a lower (inner) sequence (row). Further, the interval between the edges of the electrodes can be easily made different by providing different sizes of the electrodes from place to place. Especially, the intervals between electrodes are made greater on the peripheral side of the array than on the inner side. Given that the number of electrodes inside the array is greater for an array in which the interval is greater on the peripheral side, the greater interval on the peripheral side is required to provide a sufficient space for the wires to access the peripheral positions. In addition, the same effect is obtained by providing a smaller number of electrodes on the inner side, and making the interval on the peripheral side smaller. Further, spaces for vias can be obtained by sparsely arranging electrodes near the center of the device package, the vias being for the central electrodes to access the peripheral positions, while outer electrodes access the peripheral positions using the surface of the PWB. Accordingly, electrodes immediately adjacent to the electrodes that are pulled out using vias of the PWB can be arranged with smaller intervals, given that they do not have to be spaced so as to provide a wiring space between corresponding pads, and do not require vias. Compared with the interval between the electrodes immediately adjacent to the electrodes that are pulled out using the vias, the interval to the electrodes of the next sequence (row) is made greater such that the vias can be provided. In this manner, efficient wiring is realized. In addition, in the case that the electrodes are sparse in the central part of the device package, wires of the inner electrodes of the device packages (BGA, etc.) are pulled out using the surface of the PWB. For this reason, from the relations between the pads and the corresponding electrodes that are located immediately before and after the electrodes that are pulled out using the vias, the same effect is acquired. Further, it is also possible to increase the number of electrode rows by changing (narrowing) the interval between the electrode rows. Further, the present invention provides an electronic apparatus using the device package and the PWB according to the present invention, which realizes reductions in cost and dimensions.

DESCRIPTION OF THE PREFERRED EMBODIMENTS

In the following, embodiments of the present invention are described with reference to the accompanying drawings.

Figure 1A:
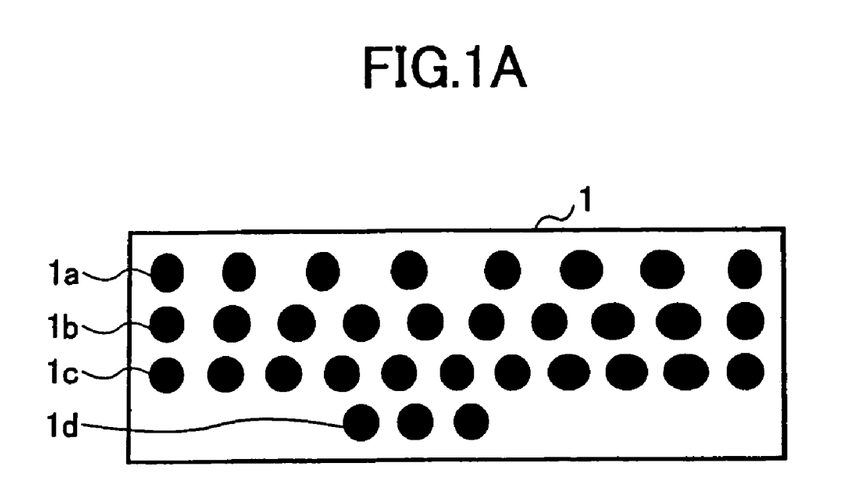
FIGS. 1A and 1B give layout diagrams showing examples of device package bottom electrode arrangements according to the present invention, and according to conventional practice.
Figure 1B:
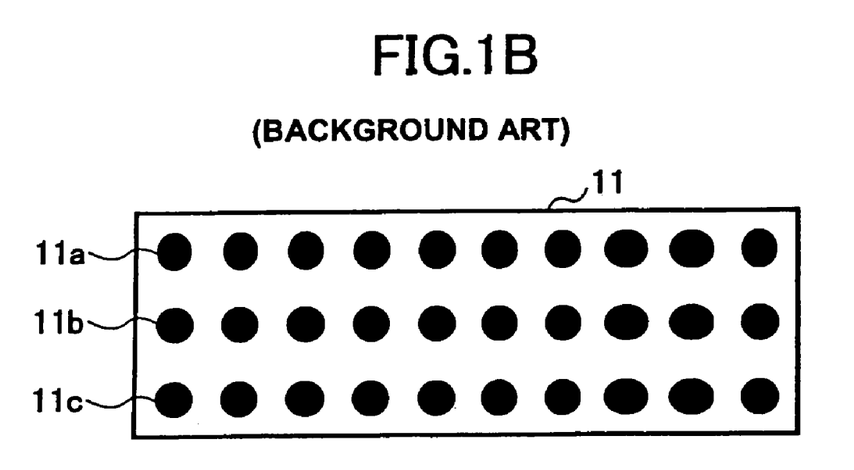
Figure 2A:
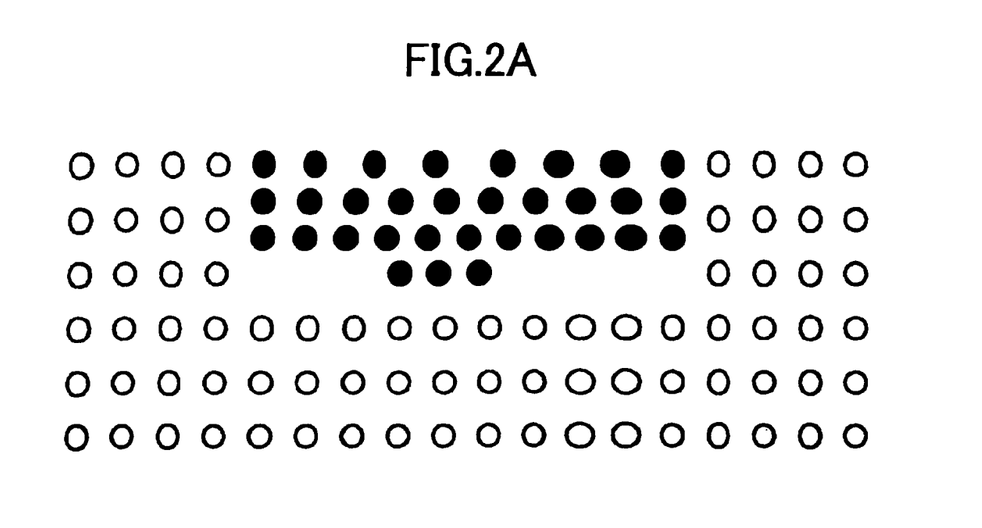
FIGS. 2A and 2B give layout diagrams showing printed wiring board (PWB) pad arrangements according to the present invention, and according to the conventional practice.
Figure 2B:
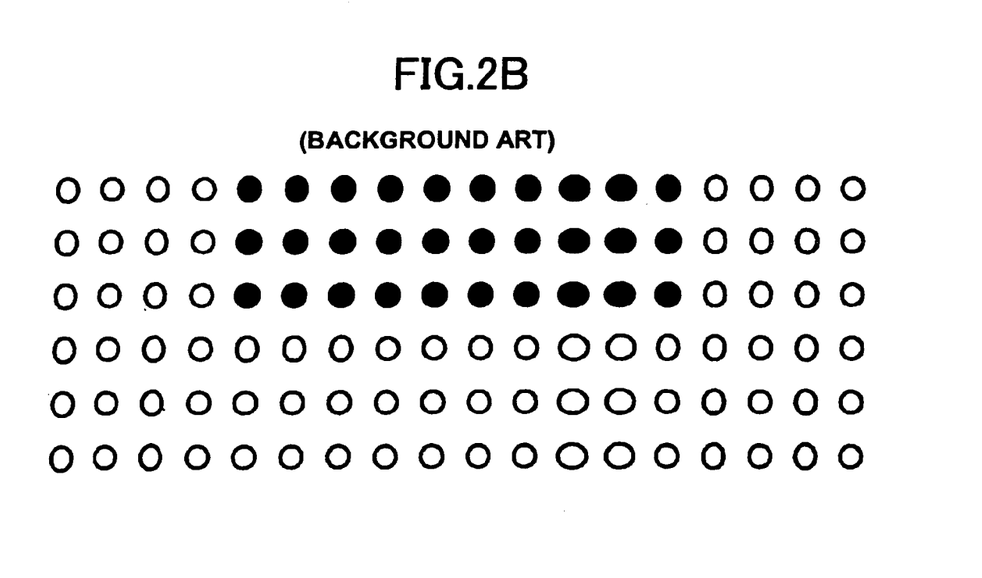

FIGS. 1A and 1B give layout diagrams showing examples of device package bottom electrode arrangements according to the present invention, and according to conventional practice, and FIGS. 2A and 2B give layout diagrams showing printed wiring board (PWB) pad arrangements according to the present invention, and according to the conventional practice.

A device package 1 shown in FIG. 1A is mounted on a PWB shown in FIG. 2A. A device package 11 shown in FIG. 1B is mounted on a PWB shown in FIG. 2B.

For a given wiring density (a line width and an interval) of a PWB, the number of wires that can be provided between the pads of the PWB depends on the distance between the edges of the electrodes of the device package, the pads corresponding to the electrodes of the device package for surface mounting to the PWB. Further, since it is necessary to provide a certain space on the PWB when a via should be provided on the PWB, availability of space for the via is dependent on the distance between the edges of the pads that correspond to the electrodes of the device package.

For example, suppose that two wires can be accommodated in each interval between pads (black dots and white circles) in the case of the pad arrangement shown in FIG. 2B; then, first 3 rows of the pads (corresponding to rows 11a-11c in FIG. 1B) can be pulled out by wiring without using a via. For example, as for the pads shown by the black dots, wires for 30 pins are available.

On the other hand, the pad arrangement shown in FIG. 2A includes non-uniform intervals between the pads, the pads corresponding to the electrodes arranged as shown in FIG. 1A.

In the example shown in FIG. 2A, intervals between the black dots in the first row (corresponding to row 1a in FIG. 1A) are set up such that three wires can be accommodated per interval, intervals between the black dots in the second row (corresponding to row 1b in FIG. 1A) are set up such that two wires can be accommodated per interval, and intervals between the black dots in the third row (corresponding to row 1c in FIG. 1A) are set up such that one wire can be accommodated per interval.

With the pad arrangement as described above, the first three rows of the black dots are arranged at a finer row pitch than the white dots of the first three rows such that a fourth row of black dots (corresponding to row 1d in FIG. 1A) is provided. The fourth row can include three pads that have respective wires. That is, 32 pins can be provided with respective wires to the device package 1.

In this manner, the non-uniform arrangement of the pads and corresponding electrodes provides additional wire accommodation capacity. In the present example (shown in FIG. 1A and FIG. 2A), 32 pins can be accommodated as compared with the uniform arrangement (shown in FIG. 1B and FIG. 2B) being capable of accommodating 30 pins.

Figure 3:
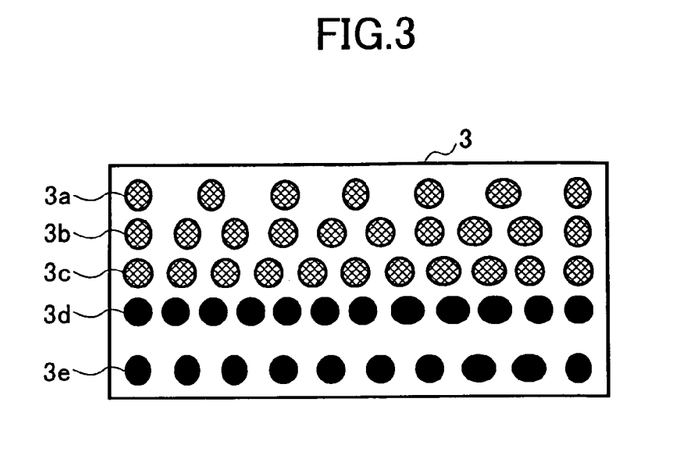
FIG. 3 is a layout diagram showing another example of the device package bottom electrode arrangement according to the present invention.
Figure 4:
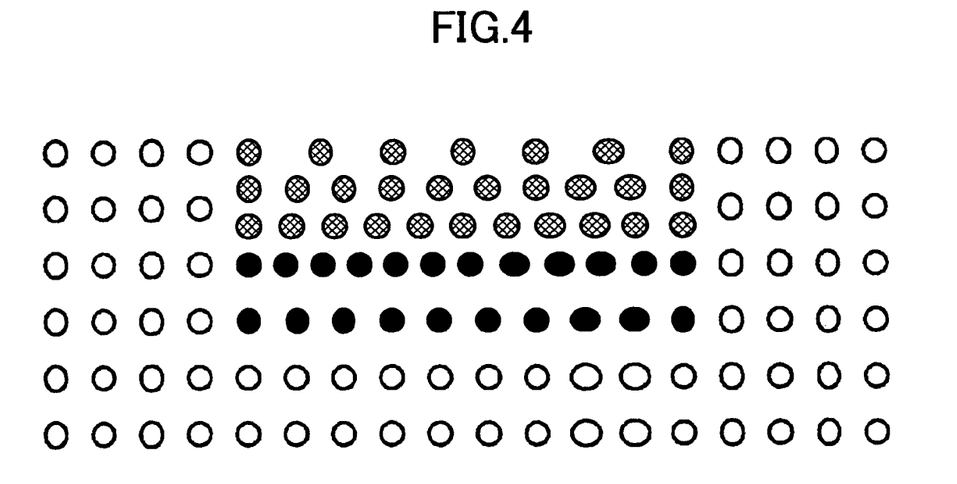
FIG. 4 is a layout diagram showing another example of PWB pad arrangement according to the present invention.

FIG. 3 is a layout diagram showing another example of the bottom electrode arrangement of a device package 3 according to the present invention, and FIG. 4 is a layout diagram showing another example of the PWB pad arrangement according to the present invention. The device-package 3 shown in FIG. 3 is mounted on the PWB shown in FIG. 4.

In the present example of the device package 3 shown by FIG. 3, electrode intervals are different for each of rows 3a through 3e. Further, the interval between the rows 3d and 3e is made to be different from (greater than) other intervals between the rows.

The pad arrangement shown in FIG. 4 corresponds to the electrode arrangement shown in FIG. 3, providing different electrode intervals for different rows.

According to the pad arrangement as described above, a large space becomes available between the rows corresponding to the electrode rows 3d and 3e, which space allows vias to be provided.

Figure 5A:
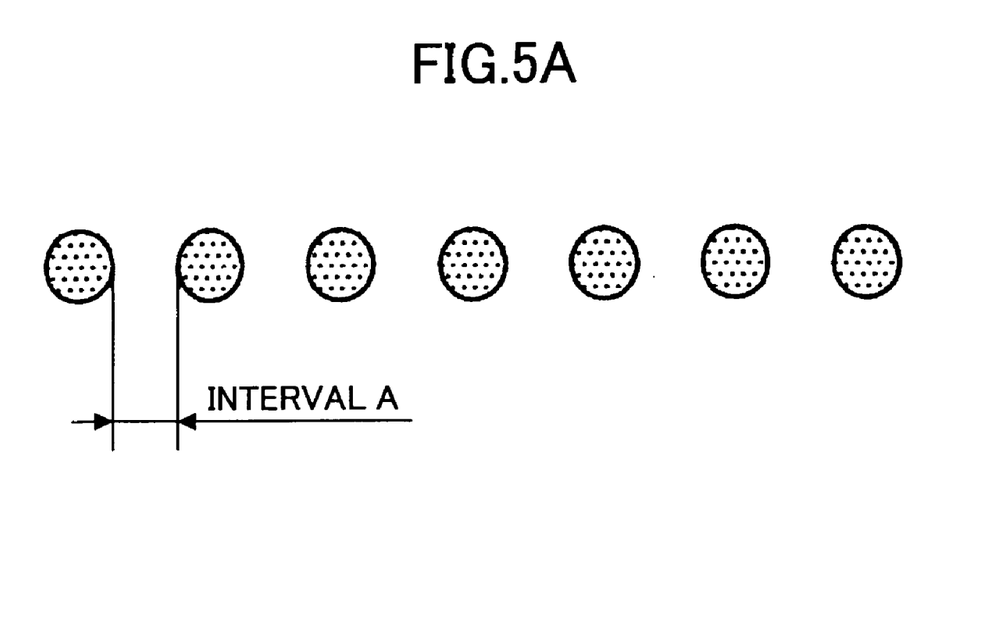
FIGS. 5A and 5B give layout diagrams showing an example of electrode array arrangements of the device package according to the present invention, wherein distances between the edges of the electrodes are set to be different from place to place.
Figure 5B:
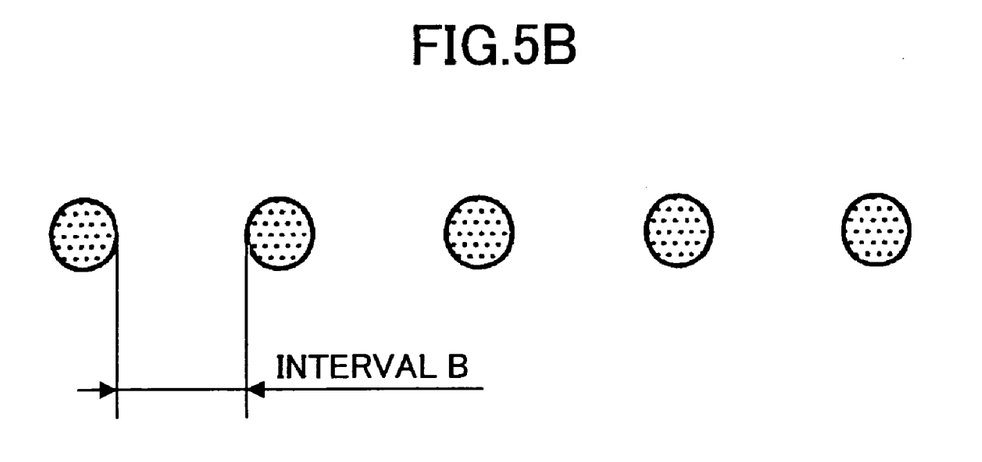
Figure 6A:
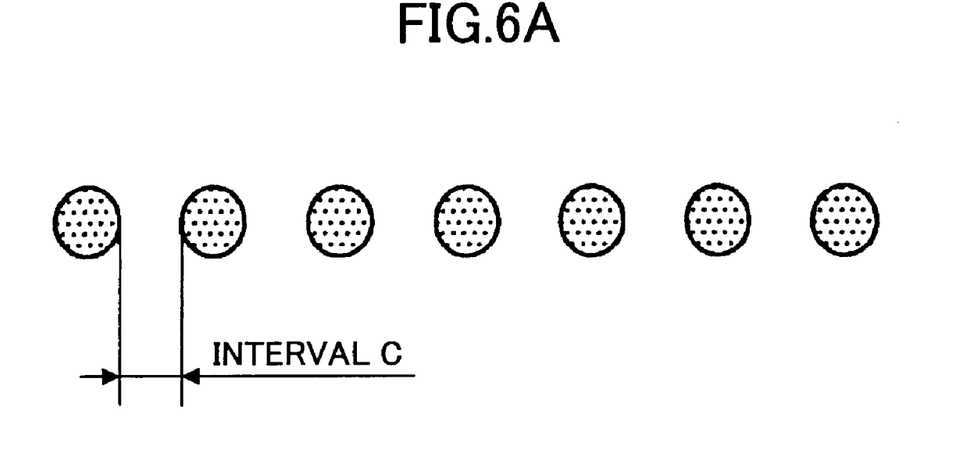
FIGS. 6A and 6B give layout diagrams showing another example of electrode array arrangements of the device package according to the present invention, wherein distances between the edges of the electrodes are set to be different from place to place.
Figure 6B:
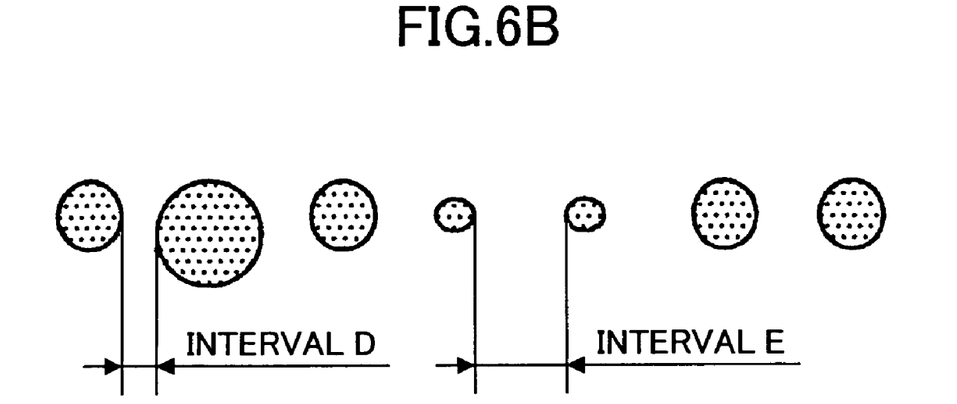

FIGS. 5A and 5B give layout diagrams showing an example of electrode array arrangements of the device package according to the present invention, wherein distances between the edges of the electrodes are set to be different from place to place. FIGS. 6A and 6B give layout diagrams showing another example of electrode arrangements of the device package according to the present invention, wherein distances between the edges of the electrodes are set to be different from place to place.

The electrode interval is set to A in FIG. 5A, while the electrode interval is set to B in FIG. 5B, where A and B are not equal. In this manner, the electrode intervals of different rows are made to be different. Namely, the electrodes and the corresponding pads are arranged not in the shape of a grid. The pad arrangement (not shown) corresponds to the electrode arrangement.

Different electrode intervals are obtained by providing different sizes of electrodes in the example shown in FIGS. 6A and 6B. In FIG. 6A, uniform intervals are provided, and in FIG. 6B, different intervals are provided, the different intervals resulting from the different sizes of the electrodes. The pad arrangement (not shown) corresponds to the electrode arrangement.

Figure 7:
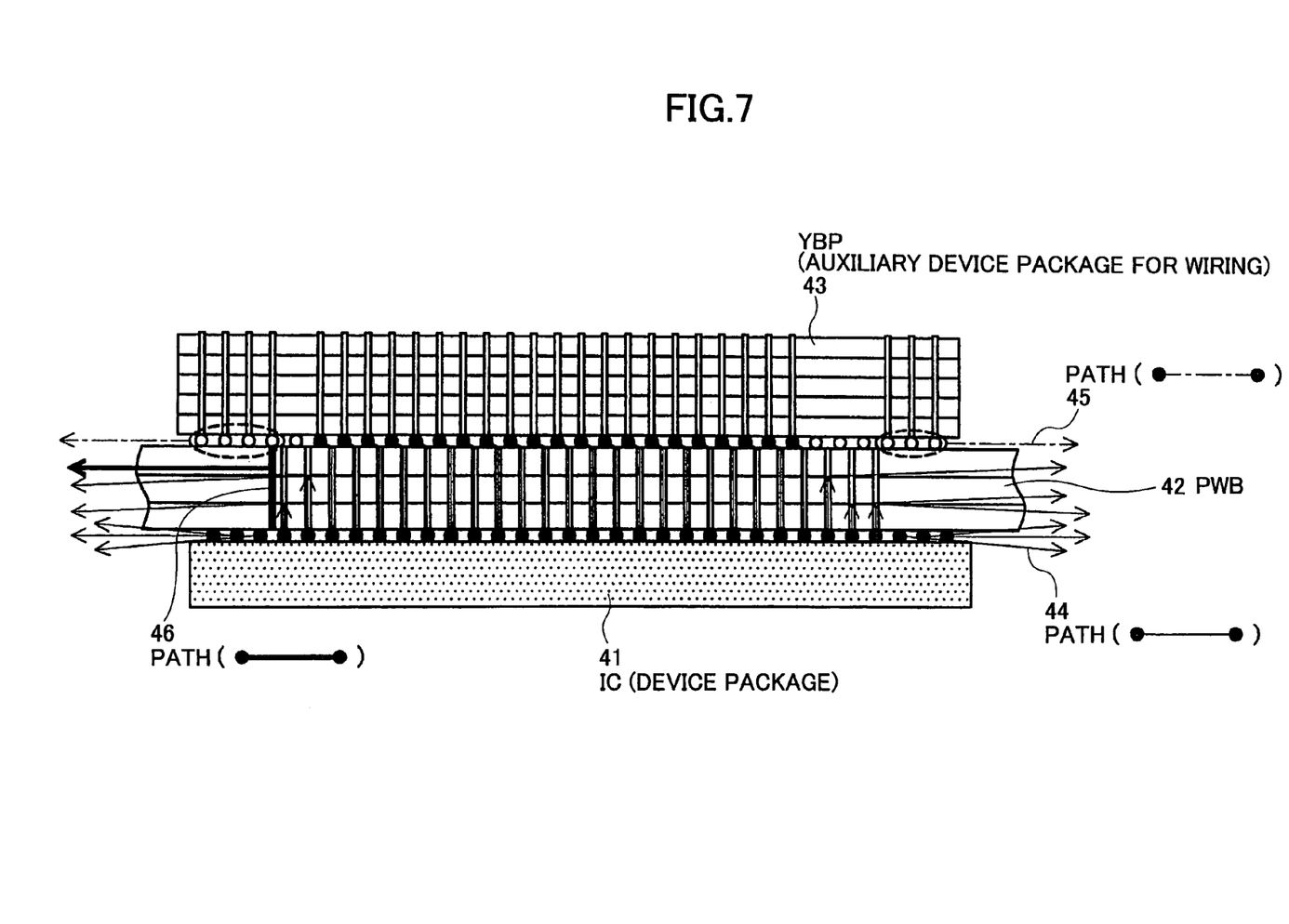
FIG. 7 is a cross-sectional view of an electronic apparatus using the device package and the PWB according to the present invention.

FIG. 7 is a cross-sectional view of an electronic apparatus using the device package and PWB according to the present invention.

The electronic apparatus shown by FIG. 7 includes a "device package" and "PWB" according to the present invention, and the "the auxiliary device package for wiring" of the conventional technology. The electronic apparatus can be such as a portable telephone, a personal computer, a television set, a refrigerator, a washing machine, an air-conditioner, and any electronic product for cars and airplanes, etc.

The electronic apparatus shown in FIG. 7 includes a device package 41 (indicated as "IC" in FIG. 7), a PWB 42 (indicated as "PWB"), an auxiliary device package for wiring 43 (YBP), and wiring paths 44 through 46, where the device package 41 and the PWB 42 are according to the present invention. In the configuration as above, where the auxiliary device package for wiring 43 (YBP) is used, the device package 41 and the PWB 42 according to the present invention provide further effective wiring provision in small sizes and at less cost.

The auxiliary device package for wiring 43 (YBP) used in the example shown in FIG. 7 is a bypass device package. According to the conventional practice, wiring for 42 pins out of 441 pins of the device package 41 is yet to be solved as explained below, the 441 pins having to be routed through the YBP 43. Details are described below at "Conditions of the example" and "Explanation of the example".

In contrast, according to the present invention, all the 411 pins can be pulled out. Details are described below at "According to the present invention".

Conditions of the Example (a) Conditions of the PWB 42:
 Number of layers=4
 Pad size=0.6 mm
 Via:
 Land size of surface via=0.5 mm
 Land size of inner layer via=0.76 mm
 Line width/space width=0.1 mm/0.1 mm
 Solder resist position accuracy=±0.075 mm (b) Conditions of the device package 41:
 32 rows×32 columns (1024 pins, full grid array)
 Pitch between electrode rows=1.27 mm (c) Conditions of the auxiliary device package for wiring (YBP) 43: the same as the PWB 42 except that the number of layers is six.

Explanation of the Example

The device package 41 has 32×32=1024 pins. The cross-sectional drawing FIG. 7 shows 32 black dots representing 32 pins of the device package 41.

Of the 1024 pins of the device package 41, 583 pins are pulled out to the PWB 42 through the wiring path 44 using layers 1 through 3 of the PWB 42: six outer rows (six black dots on the right hand side in FIG. 7) for each of two sides (plan view not shown), and five outer rows (five black dots on the left hand side in FIG. 7) for each of the remaining two sides of the 32×32 pin array. Namely, the number 583 is derived by 32×6×2+32×5×2−6×6−6×5×2−5×5=583.

Accordingly, the remainder is 441 pins (1024−583=441), the wiring of which pins is the next concern to be addressed.

Here, the layer on which the YBP 43 is mounted is reserved for wires from the YBP 43 to the PWB 42.

As described above, the number of pins, of which wiring problem has to be solved, remaining in the center of the device package 41 is 441 (i.e., a full grid of 21×21, where 21=32−6−5). The 441 pins are pulled out to the corresponding 441 pins in the center of the YBP 43 through vias of the PWB 42.

From the central pins of the YBP 43, using layers 1 through 6, eleven wires can be pulled out in each direction, and accordingly, 22 rows of 22 pins each, equaling 484 pins (22×22=484) can be pulled out to peripheral terminals of the YBP 43, more than sufficient for the central 441 pins to then be connected to the PWB 42. Further, by installing the YBP 43 at a position slightly (a half the interval between the pads) shifted in reference to the device package 41, three vias can be prepared between the pads on two sides of the PWB 42, as indicated by first three white circles encircled by a dotted line on the left hand side of FIG. 7. Further, as for these two sides of the PWB 42, an additional wire can be pulled out using the wiring path 46 one layer below the surface, which is indicated by the fourth white circle encircled in the dotted line, the fourth white circle being connected to wiring path 46. Accordingly, from two sides, four outer rows can be pulled out. As for the remaining two sides, three outer rows can be pulled out from the surface layer of the PWB 42, as shown by three white circles in a dotted line on the right hand side in FIG. 7.

Therefore, as for pulling out the remaining 441 pins of the device package 41 to the PWB 42 using the peripheral terminals of the YBP 43, which provides four rows on two sides and three rows on the remaining two sides, 399 pins can be pulled out, i.e., 32×4×2+32×3×2−4×4−4×3×2−3×× 3=399. That is, wiring of 42 pins is a problem yet to be solved.

ACCORDING TO THE PRESENT INVENTION

According to the present invention, the same pad size, i.e., 0.6 mm is used, and pad pitches (intervals) are arranged as follows. The pad pitch of the outermost row is set at 1.4 mm, providing 29 pads. Three wires can be arranged through the pad pitch. Next, the pad pitch of the second outermost row is set at 1.2 mm, providing 30 pads. This pad pitch allows two wires to pass through. The pad pitch of the third outermost row is set at 1.0 mm, providing 35 pads. This pad pitch allows only one wire to pass through. The pad pitch of the fourth outermost row is set at 0.85 mm, providing 38 pads. This pad pitch does not allow any wire to pass through. Here, the pitch between the rows (row pitch, or row interval) is set at 0.85 mm. Accordingly, the four rows described above occupy 3.4 mm, which is 4×0.85 mm. This compares with the conventional arrangement where the three rows occupy 3.81 mm, which is 3×1.27 mm. The pad arrangement according to the present invention, where the pad pitches are differentiated from row to row, allows 512 pins to be pulled out from the surface layer using the area occupied by the four rows (conventionally three rows), while 441 pins need to be pulled out to the PWB 42 via the auxiliary device package (YBP) 43. The number, 512, is derived from (29 pad intervals×4−4)+(30 pad intervals×4−4)+(35 pad intervals×4−4)+(38 pad intervals×4−4)=512.

As described above using FIGS. 1 through 7, the electrodes of the device package mounted on the PWB, and the corresponding pads of the PWB are prepared such that the distances between the edges of the electrodes and between the edges of the corresponding pads differ from place to place. The distances between the edges of the pads of the PWB corresponding to the electrodes of the device package are adjusted according to the required number of wires to pass between the pads, and depending on whether vias are to be provided. In this manner, efficient wiring between the device package and the PWB is realized.

For example, the distances between edges of the electrodes of the device package can be easily made different from place to place by arranging the electrodes not in the shape of a grid, and by making the sizes of the electrodes of the device package different from place to place. Further, it is also possible to increase the number of rows by adjusting (narrowing) the pitch between the electrode rows.

Further, according to the present invention, the distance between the edges of the electrodes and between the edges of the pads are made greater for the electrodes and the pads that reside in peripheral positions. This takes into consideration that, as for a target electrode of a device package (BGA, etc.), the number of electrodes that reside in the inner side of the target electrode becomes the greater as the target electrode resides further outward, that is, the greater number of wires have to pass through the interval between the electrodes that reside to the peripheral side. Therefore, the intervals between the edges of the electrodes are made greater for the electrodes that reside to the peripheral side, and wiring is facilitated. In addition, in the case that the electrodes are sparse in the central part of the device package (BGA) having bottom electrodes, the same effect can be acquired by providing a narrower distance between the edges of the electrodes that reside to the outside.

Further, when the distances between the edges are made different from place to place, the distances between the edges are made greater for the inner rows. In this case, wires of the electrodes near the outmost rows are pulled out using the surface layer of the PWB, and the wires of the inner electrodes are pulled out using the vias. Accordingly, as for the electrodes of a row that is immediately before the electrode row that uses the vias, they can be arranged without considering a space for wiring for the inner electrodes, i.e., with narrow spacing. The electrodes that reside immediately after the electrodes that are pulled out through the vias are arranged with a greater distance such that the vias can be arranged between the pads corresponding to the electrodes. In this manner, wiring is facilitated.

In addition, in the case that the electrodes are sparse in the central part of the device package, wires of the inner electrodes of the device package (BGA, etc.) are pulled out using the surface of the PWB. For this reason, from the relations between the pads and the corresponding electrodes that are located immediately before and after the electrodes that are pulled out using the vias, the same effect is acquired.

In addition, the present invention is not limited to the examples and embodiments described above using FIGS. 1 through 7, but can be modified without departing from the scope of the present invention. For example, the technology of "arranging the array electrodes and pads not in the shape of a grid" (FIGS. 5A and 5B), and the technology of "making the sizes of the electrodes and the pads different" (FIGS. 6A and 6B) are individually described above. Nevertheless, the technologies can be used in combination.

Further, the present invention is not limited to these embodiments, but various variations and modifications may be made without departing from the scope of the present invention.

The present application is based on Japanese Priority Application No. 2003-401439 filed on Dec. 1, 2003, with the Japanese Patent Office, the entire contents of which are hereby incorporated by reference.

What is claimed is:

1. A device package to be mounted on the surface of a printed wiring board, comprising:

bottom electrodes in a first row, which is an outermost row, and a second row parallel and adjacent to the first row, arranged such that intervals between edges of bottom electrodes in a section of the first row progressively increase in length from an end of the section of the first row toward a center of the first row such that an interval between a first electrode disposed at an end of the section of the first row and a second electrode in the first row, which is a next electrode closer to the center of the first row after the first electrode, is shorter than an interval between the second electrode and a third electrode, which is a next electrode after the second electrode within the first row, wherein the interval between the second electrode and third electrode is shorter than an interval between the third electrode and a fourth electrode, which is a next electrode after the third electrode within the first row, the fourth electrode is closer to the center than is the third electrode, and the interval between the first and second electrodes is unobstructed by any other electrode, the interval between the second and third electrodes is unobstructed by any other electrode, and the interval between the third and fourth electrodes is unobstructed by any other electrode, a first second-row electrode is located in the second row and aligned with the first electrode in a direction perpendicular to the first row, and an interval between the first second-row electrode and a second second-row electrode, which is a next electrode closer to the center of the second row after the first second-row electrode, is shorter than the interval between the first electrode and the second electrode;

further comprising a third row parallel to the first row and including a first third-row electrode aligned with the first electrode in a direction perpendicular to the first row, and a second third-row electrode, which is a next electrode closer to a center of the third-row after the first third-row electrode, positioned such that an interval between the first third-row electrode and the second third-row electrode is shorter than the interval between the first electrode and the second electrode, wherein the interval between the first third-row electrode and second third-row electrode is shorter than the interval between the first second-row electrode and the second second-row electrode.

2. A device package to be mounted on the surface of a printed wiring board, comprising:

a plurality of bottom electrodes arranged in a first row, which is an outermost row of the package, and a second row parallel and adjacent to the first row and not in the shape of a grid such that intervals between edges of bottom electrodes in a section of the first row progressively increase in length from an end of the section the first row toward a center of the first row such that an interval between a first electrode disposed at an end of the section of the first row and a second electrode in the first row, which is a next electrode closer to the center of the first row after the first electrode, is shorter than an interval between the second electrode and a third electrode, which is a next electrode after the second electrode within the first row, wherein the interval between the second electrode and third electrode is shorter than an interval between the third electrode and a fourth electrode, which is a next electrode after the third electrode within the first row, the fourth electrode is closer to the center than is the third electrode, and the interval between the first and second electrodes is unobstructed by any other electrode, the interval between the second and third electrodes is unobstructed by any other electrode, and the interval between the third and fourth electrodes is unobstructed by any other electrode, a first second-row electrode is located in the second row and aligned with the first electrode in a direction perpendicular to the first row, and an interval between the first second-row electrode and a second second-row electrode, which is a next electrode closer to the center of the second row after the first second-row electrode, is shorter than the interval between the first electrode and the second electrode, further comprising a third row parallel to the first row and including a first third-row electrode aligned with the first electrode in a direction perpendicular to the first row, and a second third-row electrode, which is a next electrode closer to a center of the third-row after the first third-row electrode, positioned such that an interval between the first third-row electrode and the second third-row electrode is shorter than the interval between the first electrode and the second electrode, wherein the interval between the first third-row electrode and second third-row electrode is shorter than the interval between the first second-row electrode and the second second-row electrode.

3. A device package to be mounted on the surface of a printed wiring board, comprising:

a plurality of bottom electrodes arranged in a first row, which is an outermost row of the package, and a second row parallel and adjacent to the first row and not in the shape of a grid such that intervals between edges of bottom electrodes in a section of the first row progressively increase in length from an end of the section of the first row toward a center of the first row such that an interval between a first first-row electrode disposed at an end of the section of the first row and a second first-row electrode in the first row, which is a next electrode closer to the center of the first row after the first electrode, is shorter than an interval between the second first-row electrode and a third first-row electrode, which is a next electrode after the second first-row electrode within the first row, wherein the interval between the second first-row electrode and third first-row electrode is shorter than an interval between the third first-row electrode and a fourth first-row electrode, which is a next electrode after the third first-row electrode within the first row, the fourth first-row electrode is closer to the center than is the third first-row electrode, and the interval between the first and second first-row electrodes is unobstructed by any other electrode, the interval between the second and third first-row electrodes is unobstructed by any other electrode, and the interval between the third and fourth first-row electrodes is unobstructed by any other electrode, wherein a third row is disposed adjacent the second row on a side of the second row opposite the first row, and an unobstructed interval between a first third-row electrode and second third-row electrode is equal to an unobstructed interval between the second third-row electrode and a third third-row electrode, and the first third-row electrode is aligned with the first first-row electrode and a first second-row electrode in a direction perpendicular to the first row.

4. The device package as claimed in claim 3, wherein the first third-row electrode, second third-row electrode, and third third-row electrode are all disposed on a same line.

5. The device package as claimed in claim 3, wherein an unobstructed interval between the first second-row electrode and a second second-row electrode, which is a next electrode closer to the center of the second row after the first second-row electrode, is shorter than the interval between the first first-row electrode and the second first-row electrode.

6. The device package as claimed in claim 5 wherein a second third-row electrode, which is a next electrode closer to a center of the third row after the first third-row electrode, is positioned such that an interval between the first third-row electrode and the second third-row electrode is shorter than the interval between the first first-row electrode and the second first-row electrode.

7. The device package as claimed in claim 5, wherein a center of the second first-row electrode is not aligned with a center of the second second-row electrode in the direction perpendicular to the first row.

8. A device package to be mounted on the surface of a printed wiring board, comprising:

bottom electrodes in a first row, which is an outermost row, and a second row parallel and adjacent to the first row, arranged such that intervals between edges of bottom electrodes in a section of the first row progressively increase in length from an end of the section of the first row toward a center of the first row such that an interval between a first first-row electrode disposed at an end of the section of the first row and a second first-row electrode in the first row, which is a next electrode closer to the center of the first row after the first first-row electrode, is shorter than an interval between the second first-row electrode and a third first-row electrode, which is a next electrode after the second first-row electrode within the first row, wherein the interval between the second first-row electrode and third first-row electrode is shorter than an interval between the third first-row electrode and a fourth first-row electrode, which is a next electrode after the third first-row electrode within the first row, the fourth first-row electrode is closer to the center than is the third first-row electrode, and the interval between the first and second first-row electrodes is unobstructed by any other electrode, the interval between the second and third first-row electrodes is unobstructed by any other electrode, and the interval between the third and fourth first-row electrodes is unobstructed by any other electrode, wherein a third row is disposed adjacent the second row on a side of the second row opposite the first row, and an unobstructed interval between a first third-row electrode and second third-row electrode is equal to an unobstructed interval between the second third-row electrode and a third third-row electrode, and the first third-row electrode is aligned with the first first-row electrode and a first second-row electrode in a direction perpendicular to the first row.

9. The device package as claimed in claim 8, wherein the bottom electrodes are arranged such that distances between edges of the bottom electrodes in the first row are set wider than distances between edges of electrodes in the third row disposed such that the second row is between the first and third rows.

10. The device package as claimed in claim 8, wherein the bottom electrodes of the second row are arranged such that distances between edges of the bottom electrodes of the second row are set narrower than inner positions on a side of the second row opposite the first row.

11. The device package as claimed in claim 8, wherein the first third-row electrode, second third-row electrode, and third third-row electrode are all disposed on a same line.

12. The device package as claimed in claim 8, wherein intervals between rows of the bottom electrodes are different from interval to interval.

13. A printed wiring board configured to mount the device package as claimed in claim 8, comprising:
pads that are arranged corresponding to the bottom electrodes.

14. An electronic apparatus, comprising:
the printed wiring board as claimed in claim 13; and
the device package.

15. The device package as claimed in claim 8, wherein an unobstructed interval between the first second-row electrode and a second second-row electrode, which is a next electrode closer to the center of the second row after the first second-row electrode, is shorter than the unobstructed interval between the first first-row electrode and the second first-row electrode.

16. The device package as claimed in claim 15
wherein a second third-row electrode, which is a next electrode closer to a center of the third row after the first third-row electrode, is positioned such that an unobstructed interval between the first third-row electrode and the second third-row electrode is shorter than the interval between the first first-row electrode and the second first-row electrode.

17. The device package as claimed in claim 15, wherein a center of the second first-row electrode is not aligned with a center of the second second-row electrode in the direction perpendicular to the first row.

* * * * *